(12) United States Patent
Matsuo et al.

(10) Patent No.: US 6,296,714 B1
(45) Date of Patent: *Oct. 2, 2001

(54) WASHING SOLUTION OF SEMICONDUCTOR SUBSTRATE AND WASHING METHOD USING THE SAME

(75) Inventors: Chizuko Matsuo; Mikio Kishimoto; Kazushige Takaishi, all of Tokyo (JP)

(73) Assignees: Mitsubishi Materials Silicon Corporation; Mitsubishi Materials Corporation, both of Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/004,199

(22) Filed: Jan. 8, 1998

(30) Foreign Application Priority Data

Jan. 16, 1997 (JP) ............................................. 9-5610
Jan. 16, 1997 (JP) ............................................. 9-5611
Jan. 16, 1997 (JP) ............................................. 9-5612

(51) Int. Cl.$^7$ ............................................. B08B 7/04

(52) U.S. Cl. ..................... 134/2; 134/3; 134/1; 134/1.3; 134/26; 134/28; 134/29; 134/27

(58) Field of Search ................................ 134/1, 1.3, 2, 3, 134/26, 28, 29, 27

(56) References Cited

U.S. PATENT DOCUMENTS

| | | | |
|---|---|---|---|
| 5,409,544 | * | 4/1995 | Ota et al. ............................ 134/22.14 |
| 5,665,168 | * | 9/1997 | Nakano et al. ......................... 134/2 |
| 5,695,569 | * | 12/1997 | Douglas .............................. 134/1.3 |
| 5,714,203 | * | 2/1998 | Schellenberger et al. ........... 134/3 X |

OTHER PUBLICATIONS

Verhaverbeke et al, Recent Advances in Wet Processing Technology and Science, MRSSP, vol. 386, pp 3–12. 1995.*

Handbook of Semiconductor Wafer Cleaning Technology, editor W. Kern, Noyes Publications, pp. 141, 142 and 420–424, 1993.*

Halliday, Physics, p. 993, 1966.*

* cited by examiner

Primary Examiner—Alexander Markoff
(74) Attorney, Agent, or Firm—Reed Smith LLP (57) ABSTRACT

Disclosed is a washing solution of a semiconductor substrate which comprises 0.0001 to 0.1% by weight of an organic acid and 0.005 to 0.25 % by weight of hydrofluoric acid and has pH of 2 to 4. When a contaminated substrate is immersed in a washing solution, a naturally oxidized film on the surface of the substrate is removed by hydrofluoric acid, and fine particles on the film, metal impurities and metal impurities in the film transfer to the liquid. Since the washing solution is an acidic solution containing an organic acid and having pH of 2 to 4, fine particles are charged to minus as those of the fine particles, and the metal impurities ions in the liquid becomes minus complex ions due to complexing effect of the organic acid. As the results, surface potentials of the respective fine particles and metal impurities are each minus which is the same as that of surface potential of the substrate so that adhesion or re-adhesion to the substrate can be prevented.

13 Claims, 6 Drawing Sheets

Prior Art

WASHING SOLUTION OF SEMICONDUCTOR SUBSTRATE AND WASHING METHOD USING THE SAME

BACKGROUND OF THE INVENTION

1. Field of the Invention

This invention relates to a washing solution for washing the surface of a semiconductor substrate such as a silicon wafer and a washing method using the same.

2. Description of the Related Art

On the surface of this kind of a semiconductor substrate, metal impurities or fine particles having a particle size of 1 μm or less are attached during the preparation process. Accompanying with high accumulation and high functionalization of a semiconductor device, it is more and more desired not to contaminated the surface of the semiconductor substrate by these metal impurities or fine particles, etc. Thus, washing technique of a semiconductor substrate is particularly important in the techniques of whole semiconductor devices.

As the conventional washing method of a semiconductor substrate, there has been known an RCA washing method using an SC1 solution comprising hydrogen peroxide and ammonium hydroxide, and an SC2 solution comprising hydrogen peroxide and a diluted hydrochloric acid. In the RCA washing method, a semiconductor substrate is firstly immersed in the SC1 solution to remove fine particles and organic residue from the substrate by the oxidizing and alkaline properties of the solution. That is, in the SC1 solution, both, reactions of oxidization and reduction are simultaneously carried out, and reduction due to ammonia and oxidization due to hydrogen peroxide occur in the same bath competitively, and simultaneously, fine particles are removed from the substrate surface by lifting off due to an etching effect of the ammonium hydroxide solution. Then, the semiconductor substrate is immersed in an acidic solution of the SC2 solution to remove alkali ions or metal impurities which are insoluble in the SC1 solution.

Figure 6:
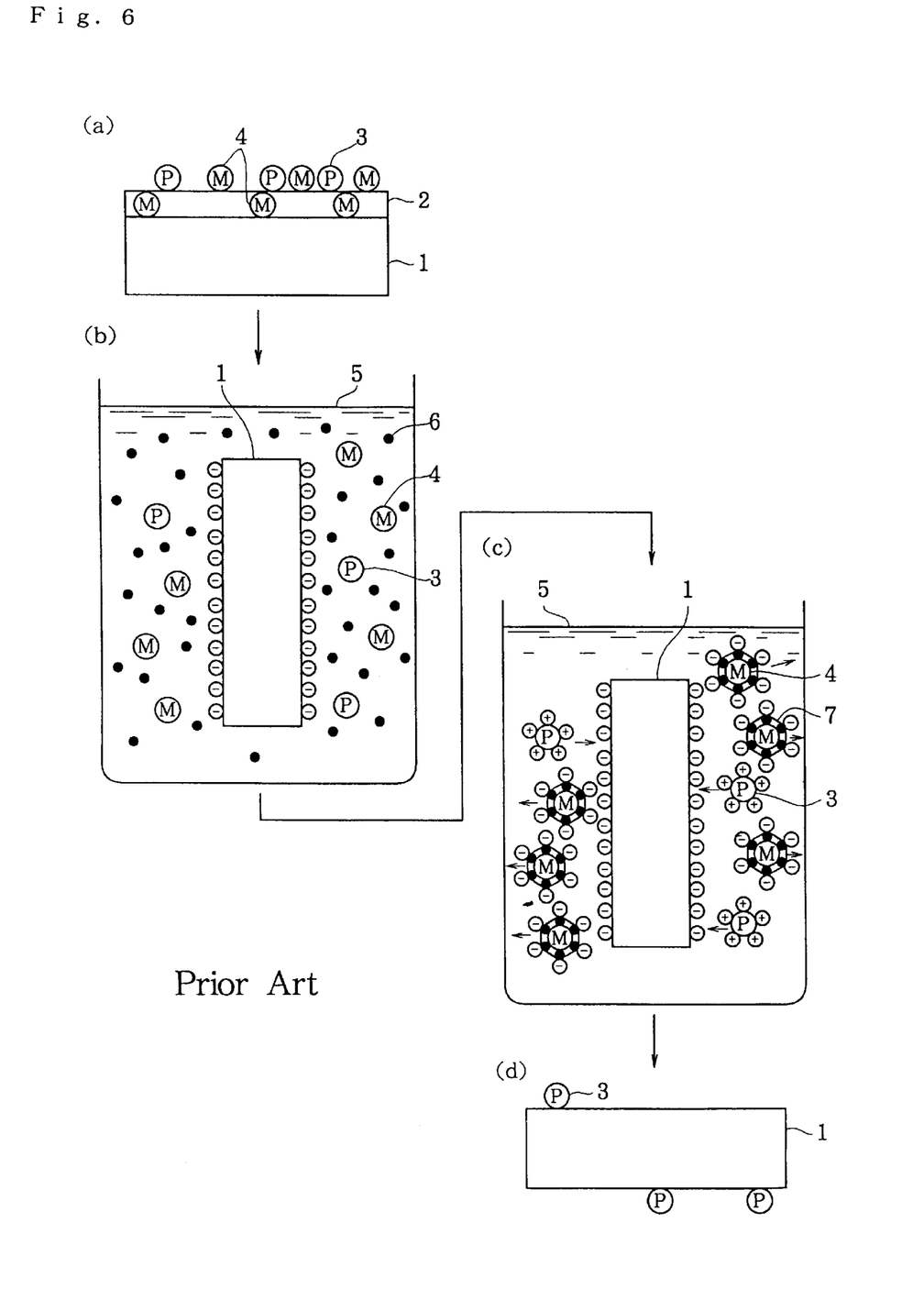
FIG. 6 is a drawing showing a washing mechanism when washing is carried out by using the conventional washing solution.

On the other hand, Japanese Laid-Open Patent Application No. 94458/1995 discloses a washing solution of a semiconductor substrate which prevents metal impurities in a washing solution from adhering to the substrate surface when the semiconductor substrate is washed or prevents metal impurities once removed from the substrate surface from adhering to the substrate surface again, and inhibits unnecessary growth of a naturally oxidized film, and a washing method using the same. This washing solution is constituted by an acidic solution such as hydrofluoric acid containing 0.0001 to 0.001% by weight of ammonia or 0.0005 to 0.01% by weight of ethylenediaminetetraacetic acid (EDTA). In this washing solution, pH thereof is maintained to 1 or so in order to remove an oxidized film. According to this washing method, when a semiconductor substrate 1 is immersed in a washing solution 5 as shown in FIG. 6, removal of a naturally oxidized film 2 and removal of metal impurities 4 are simultaneously proceed, and a metal element shifted over to the washing solution forms a complex, or a metal complex salt 7 whereby it is masked. The surface of the semiconductor substrate 1 is charged to minus in the acidic solution while the surface of the metal complex salt 7 is also charged to minus by forming a complex ion in the acidic solution so that the metal complex salt, i.e., a metal element is prevented from adhering again to the substrates However, in the above-mentioned RCA washing method, metal impurities and fine particles which contaminate the substrate are removed by two baths so that washing steps are complicated such as washing of a chemical solution and washing accompanied thereby Also, two kinds or more of acid and alkaline solutions are required as chemical solutions for washing. According to the above, there are disadvantages that this washing method requires a longer washing time, a washing device is a large-sized and a washing cost becomes expensive Also, according to the washing method described in Japanese Laid-Open Patent Application No. 94458/1995, as shown in FIGS. 6(c) and 6(d), the surfaces of fine particles 3 are charged to plus in a washing solution 5 of strong acid so that even when metal impurities 4 can be removed from the semiconductor substrate 1 by the reason as mentioned above, there is a disadvantage that fine particles 3 are adhered to the surface of the substrate 1 and cannot be removed.

Further, the above-mentioned RCA washing method occurs two reactions of oxidation and reduction in the same bath competitively. Thus, firstly, metal impurities liberated from the substrate surface is retained in the SC1 solution whereby they are sometimes adhered again to the substrate surface depending on the surface potential, and secondly, even when a metal complex salt is to be formed by complexing metal ions in the SC1 solution, an organic acid is subjected to oxidization-reduction treatment in the SC1 solution whereby its complexing effect is markedly lowered. Accordingly, there is a problem that metal impurities cannot sufficiently be removed by the RCA washing method depending on the kind of a metal.

SUMMARY OF THE INVENTION

An object of the present invention is to provide a washing solution of a semiconductor substrate for removing well both of metal impurities and fine particles adhered to the surface of the semiconductor substrate and a washing method using the same.

An invention according to a first embodiment relates to a washing solution of a semiconductor device containing 0.0001 to 0.1% by weight of an organic acid and 0.005 to 0.25% by weight of hydrofluoric acid and having pH of 2 to 4.

An invention according to a second embodiment is an invention relating to and comprises a washing solution wherein the organic the first embodiment acid is one or more organic acid selected from the group consisting of citric acid, succinic acid, ethylenediaminetetraacetic acid (hereinafter abbreviated to as EDTA), tartaric acid, salicylic acid, oxalic acid, acetic acid and formic acid.

An invention according to a third embodiment relates to a method of washing a semiconductor substrate which comprises washing a semiconductor substrate with a washing solution containing 0.0001 to 0.1% by weight of an organic acid and 0.005 to 0.25% by weight of hydrofluoric acid and having pH of 2 to 4.

An invention according to a fourth embodiment is an invention relating to the third embodiment and comprises a washing method wherein the organic acid is one or more organic acid selected from the group consisting of citric acid, succinic acid, EDTA, tartaric acid, salicylic acid, oxalic acid, acetic acid and formic acid.

DESCRIPTION OF THE PREFERRED EMBODIMENTS

Figure 1:
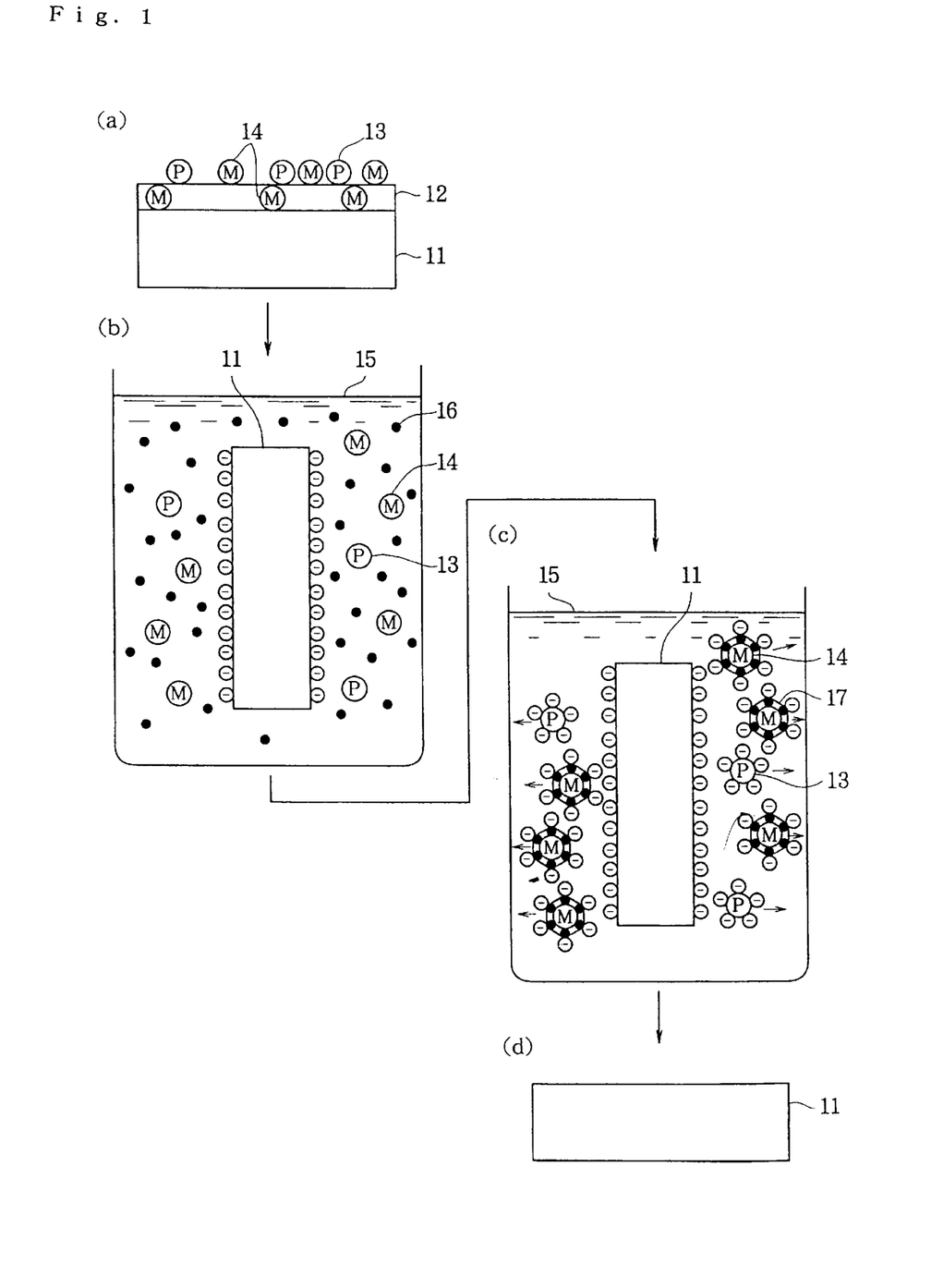
FIG. 1 is a drawing showing a washing mechanism when washing is carried out by using a washing solution according to the first embodiment of the present invention.
Figure 2:
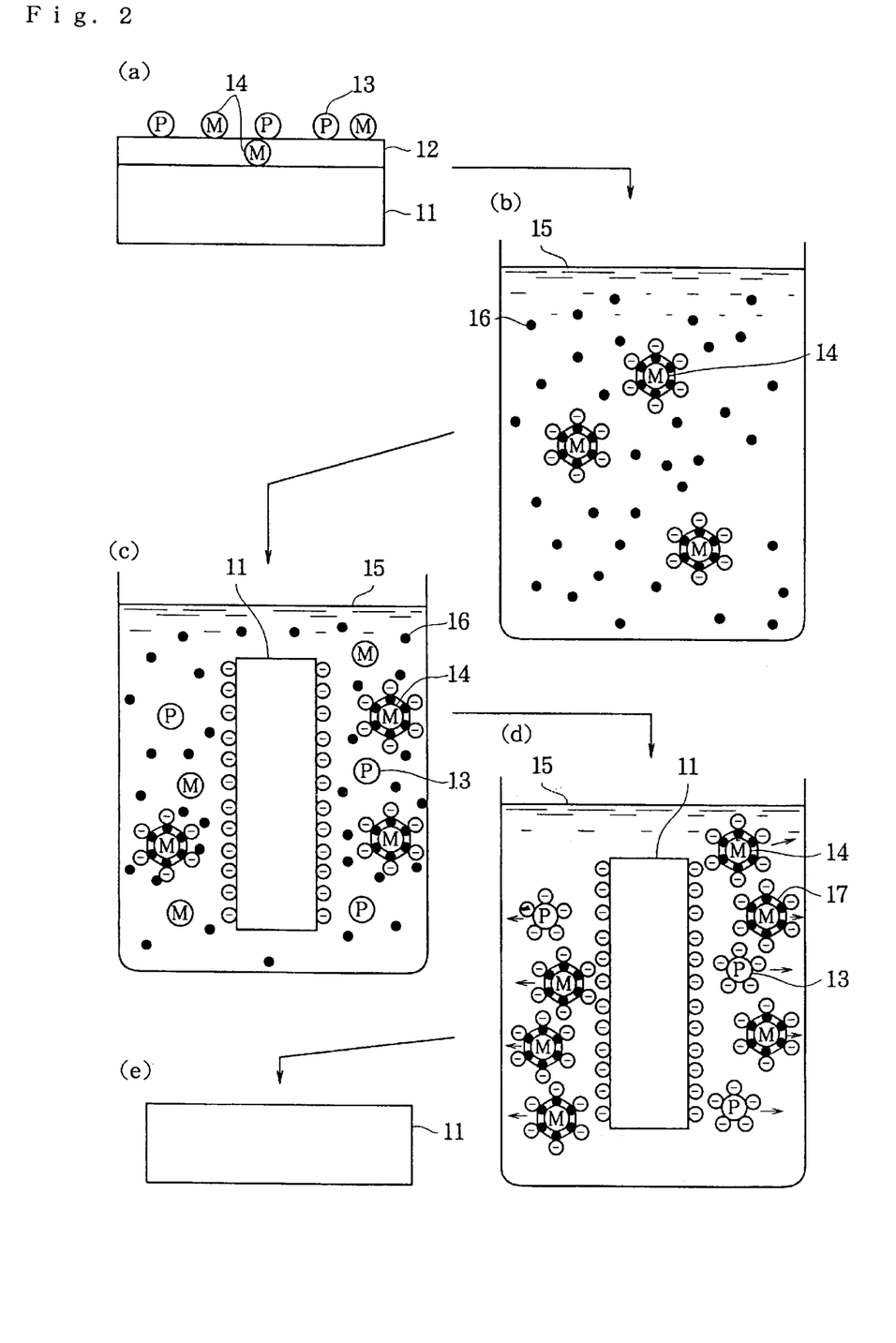
FIG. 2 is a drawing showing another washing mechanism when washing is carried out by using a washing solution according to the first embodiment of the present invention

As shown in FIGS. 1(a) and 1(b), a contaminated semiconductor substrate 11 is immersed in a washing solution 15. A naturally oxidized film 12 formed on the surface of the semiconductor substrate 11 is removed by hydrofluoric acid (HF) whereby fine particles 13 and metal impurities 14 on the naturally oxidized film 12 as well as metal impurities 14 contained in the naturally oxidized film are shifted over to the washing solution 15. Since the washing solution 15 is an acidic solution having pH of 2 to 4 and containing 0.005 to 0.25% by weight of hydrofluoric acid and 0.0001 to 0.1% by weight of an organic acid, the surfaces of the fine particles 13 are charged to minus which is the same as that of the surface of the substrate 11. Also, the metal impurities 14 liberated into the solution form a complex with organic acid molecules 16 to yield metal complex salts 17. This complex ion of the metal complex salt 17 is a minus ion. As a result, both of the surface potentials of the fine particles 13 and the metal impurities 14 become minus which is the same as that of the substrate 11 whereby adhesion or re-adhesion to the substrate can be prevented (FIG. 1(c)). When the semiconductor substrate 11 is pulled up from the washing solution 15, a substrate 11 the surface of which is cleaned can be obtained (FIG. 1(d)).

Also, as shown in FIGS. 2(a) to 2(e), even when the washing solution 15 is contaminated by metals, when a contaminated semiconductor substrate 11 is immersed in the washing solution 15, a naturally oxidized film 12 formed on the surface of the semiconductor substrate 11 is removed by hydrofluoric acid whereby fine particles 13 and metal impurities 14 on the naturally oxidized film 12 as well as metal impurities 14 contained in the naturally oxidized film are shifted over to the washing solution 15. Here, metals contaminated the washing solution 15 also form a complex with organic acid molecules 16 as well as the metal impurities 14 liberated from the substrate in the solution to yield metal complex salts 17. Since this complex ion of the metal complex salt 17 is a minus ion, similarly as in FIG. 1, adhesion or re-adhesion of the fine particles 13 and metal impurities 14 to the substrate can be prevented, and when the semiconductor substrate 11 is pulled up from the washing solution 15, a substrate 11 the surface of which is cleaned can be obtained.

An invention according to a fifth embodiment relates to a method of washing a semiconductor substrate which comprises washing a semiconductor substrate with a washing solution containing 0.0001 to 0.1% by weight of an organic acid and having pH of 2 to 4 while irradiating light with a wavelength of at least 500 nm.

A contaminated semiconductor substrate is immersed in a washing solution and light with a wavelength of at least 500 nm is irradiated to the surface of the substrate. By immersing the substrate in a washing solution, fine particles and metal impurities adhered to the substrate surface shift over to the washing solution. Since the washing solution is an acidic solution having pH of 2 to 4 and containing 0.0001 to 0.1% by weight of an organic acid, the surfaces of the fine particles are charged to minus which is the same as that of the surface of the substrate. As the results, both of the surface potentials of the fine particles and the metal impurities become minus which is the same as that of the substrate whereby adhesion or re-adhesion to the substrate can be prevented. In case where no light is irradiated to the surface of the substrate, metal impurities rear to the surface of the substrate cannot be removed any more when the reaction in the washing solution reaches to an equilibrium condition. However, when light is irradiated to the substrate surface as in the present invention, this photoirradiation brings minority carrier into existence near to the substrate surface, which reduces and dissociates an organic acid in the washing solution to make metal impurities into metal complex salts whereby an effect of removing metal impurities near to the substrate surface is enhanced.

An invention according to the sixth embodiment relates to a method of washing a semiconductor substrate which comprises washing a semiconductor substrate with a washing solution containing 0.0001 to 0.1% by weight of an organic acid and 0.005 to 0.25% by weight of hydrofluoric acid and heaving pH of 2 to 4 while irradiating light with a wavelength of at least 500 nm.

Figure 3:
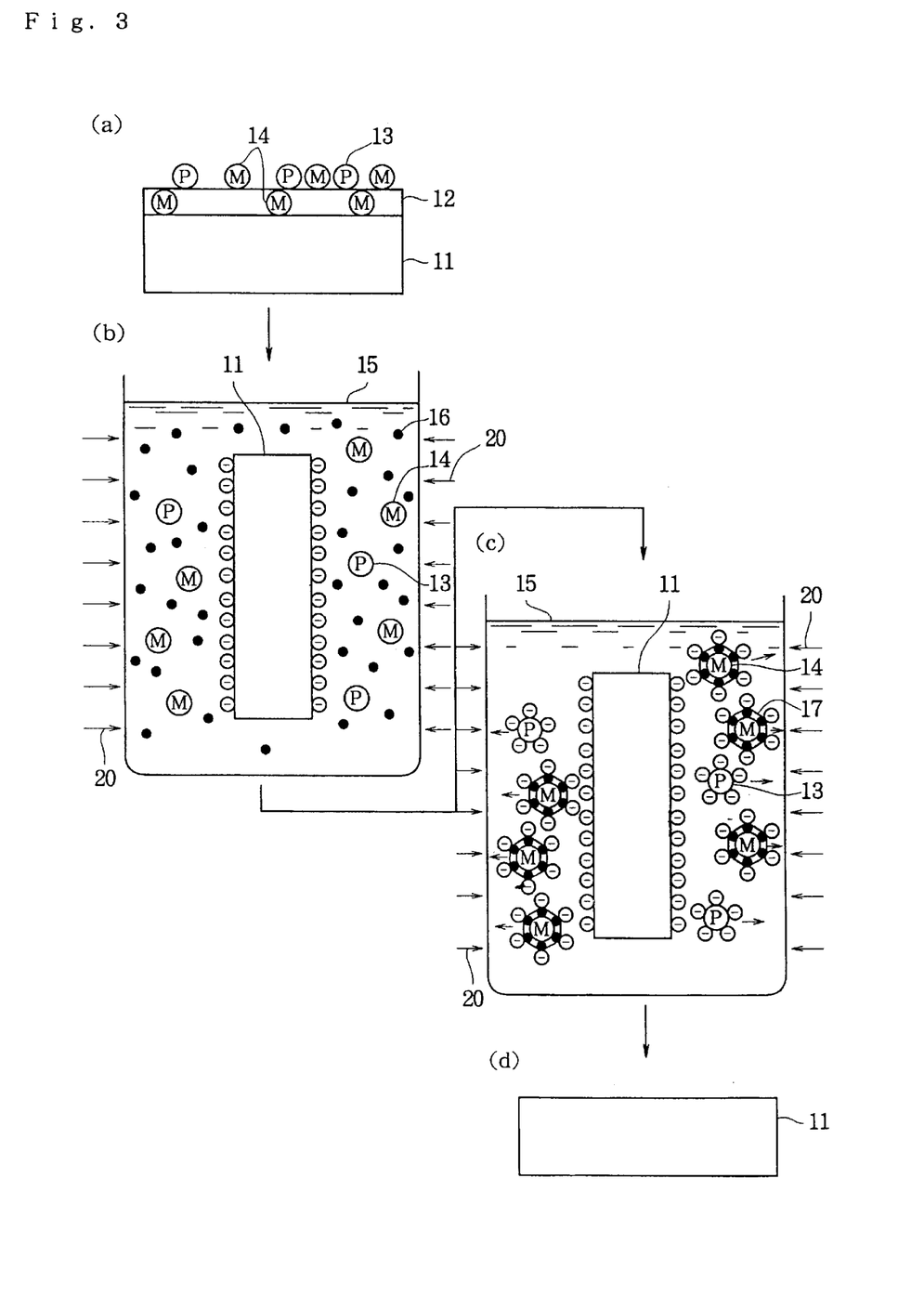
FIG. 3 is a drawing showing a washing mechanism when washing is carried out by using a washing solution according to the sixth embodiment of the present invention.

As shown in FIGS. 3(a) and 3(b), a contaminated semiconductor substrate 11 is immersed in a washing solution 15 and light 20 with a wavelength of at least 500 nm is irradiated to the surface of the substrate 11. By further containing hydrofluoric acid (HF) in the washing solution defined in the fifth embodiment, hydrofluoric acid removes a naturally oxidized film 12 formed on the surface of the semiconductor substrate 11, and fine particles 13 and metal impurities 14 on the naturally oxidized film 12 as well as metal impurities 14 contained in the naturally oxidized film are shifted over to the washing solution 15. Since the washing solution 15 is an acidic solution having pH of 2 to 4 and containing 0.005 to 0.25% by weight of hydrofluoric acid and 0.0001 to 0.1% by weight of an organic acid, the surfaces of the fine particles 13 are charged to minus which is the same as that of the substrate surface 11. Also, the metal impurities 14 liberated into the solution form a complex with organic acid molecules 16 to yield metal complex salts 17. This complex ion of the metal complex salt 17 is a minus ion. As a result, both of the surface potentials of the fine particles 13 and the metal impurities 14 become minus which is the same as that of the substrate 11 whereby adhesion or re-adhesion to the substrate can be prevented (FIG. 3(c)). In case where no light is irradiated to the surface of the substrate, metal impurities near to the surface of the substrate cannot be removed any more when the reaction in the washing solution reaches to an equilibrium condition. However, when light 20 is irradiated to the substrate surface as in the present invention, this photoirradiation brings minority carrier into existence near to the substrate surface, which reduces and dissociates an organic acid in the washing solution to make metal impurities into metal complex salts whereby an effect of removing metal impurities near to the substrate surface is enhanced. When the semiconductor substrate 11 is pulled up from the washing solution 15, the substrate 11 the surface of which is cleaned can be obtained (FIG. 3(d)).

An invention according to a seventh embodiment is an invention according to the fifth or sixth embodiment and relates to a washing method wherein the organic acid is one or more organic acid selected from the group consisting of citric acid, succinic acid, EDTA, tartaric acid, salicylic acid, oxalic acid, acetic acid and formic acid.

The above-mentioned organic acids enumerated has a complexing effect of impurity metal ions which contaminate a substrate.

A method of according to a eighth embodiment relates to a washing method of a semiconductor substrate which contains a first washing step of washing a semiconductor substrate with a mixed solution of an organic acid and hydrofluoric acid wish pH of 2 to 4, and a second washing step of washing said semiconductor substrate with an oxidizing solution.

In the first washing step, as in the invention relating to the third embodiment shown in FIGS. 1(a) to 1(c), when a naturally oxidized film 12 is removed from a contaminated semiconductor substrate 11, fine particles 13 and metal impurities 14 on the naturally oxidized film 12 as well as metal impurities 14 contained in the naturally oxidized film are shifted over to the washing solution 15. As this time, each of the surface potentials of the fine particles 13 and the metal impurities 14 becomes minus which is the same as that of the substrate 11 whereby adhesion or re-adhesion to the substrate can be prevented. When the semiconductor substrate 11 is pulled up from the washing solution 15, a substrate 11 the surface of which is cleaned can be obtained, In the second washing step, when the substrate washed in the first washing step is immersed in an oxidizing solution, a hydrophilic oxidized film is formed on the surface of the substrate by the oxidizing solution, and organic acids or organic substances adhered to the surface of the substrate are decomposed and removed without complexing metal impurities. By the formation of the oxidized film, attachment of fine particles in air to the surface of the substrate pulled up from the oxidizing solution can be prevented.

An invention relating to a ninth embodiment is an invention according to the eighth embodiment, and is a method of washing a semiconductor substrate wherein the first washing step and the second washing step are each carried out at least twice.

By repeating the first washing step and the second washing step, the surface of the substrate can be more cleaned.

An invention according to a tenth embodiment is an invention relating to the eighth or ninth embodiment, and is a method of washing a semiconductor substrate wherein the mixed solution of the first washing step contains 0.0001 to 0.1% by weight of an organic acid and 0.005 to 0.25% by weight of hydrofluoric acid.

In order to sufficiently complex metal ions which are impurities of organic acids and to prevent fine particles from adhering to the substrate again, an organic acid and hydrofluoric acid in the above-mentioned concentration ranges are preferred An invention according to an eleventh embodiment is an invention relating to the eighth or tenth embodiment, and is a method of washing a semiconductor substrate wherein the organic acid is one or more organic acid selected from the group consisting of citric acid, succinic acid, EDTA, tartaric acid, salicylic acid, oxalic acid, acetic acid and formic acid.

The above-mentioned organic acids enumerated have a complexing action of metal ions which are impurities contaminating the substrate.

An invention according to a twelfth is an invention relating to the eighth or ninth embodiment, and is a method of washing a semiconductor substrate wherein the semiconductor substrate is subjected to ultrasonic washing with the mixed solution of the first washing step.

By carrying out ultrasonic washing, fine particles can be more firmly removed from the surface of the substrate.

An invention according to the thirteenth embodiment is an invention relating to the eighth or ninth embodiment, and is a method of washing a semiconductor substrate wherein the oxidizing solution of the second washing step is a dissolved ozone aqueous solution, hydrogen peroxide solution or nitric acid.

The enumerated oxidizing solutions as mentioned above have actions of forming an oxidizing film at the surface of the substrate and of decomposing and removing organic acids or organic substances adhered to the surface of the substrate.

In the washing solution of the present invention, a kind of an organic acid and a concentration thereof are determined depending on the kind of metal impurities to be removed. pH of the washing solution is 2 to 4. A concentration of the organic acid in the washing solution is 0.0001 to 0.1% by weight, preferably 0.003 to 0.006% by weight. If it is less than 0.0001% by weight, a complexing action of metal impurity ions liberated from the surface of the substrate is not sufficient, while if it exceeds 0.1% by weight, there is a disadvantage that an amount of fine particles adhered again will increase.

As the organic acid of the present invention, in addition to citric acid, succinic acid, EDTA, suitable for the present invention are tartaric acid, salicylic acid, oxalic acid, acetic acid, formic acid and the like. One or more kinds of acids are optionally selected from the above-mentioned organic acids depending on the metal elements constituting the metal impurities.

Also, when hydrofluoric acid is contained in the washing solution, a concentration of the hydrofluoric acid is 0.005 to 0.25% by weight. Particularly in the range of 0.005 to 0.10% by weight is preferred and 0.05 to 0.1% by weight is more preferred. If it is less than 0.005% by weight, peeling effect of a naturally oxidized film on the surface of the semiconductor substrate is poor, while if it exceeds 0.25% by weight, the washing solution becomes a strong acid with pH of less than 2, whereby dissociation of the organic acid in the washing solution is prevented so that its complexing action is lowered, and also, the surface potentials of the fine particles becomes plus so that fine particles adhere again to the surface of the substrate.

When light is irradiated at the washing, a wavelength of light to be irradiated to the semiconductor substrate is at least 500 nm, preferably 500 to 900 nm, more preferably 600 to 700 nm. If it is less than 500 nm, a photocatalytic effect near to the surface of the semiconductor substrate is weak and the organic acid is not to be reduced and dissociated. Further, the higher the intensity of illumination of light is, the larger the irradiated dose is, so that the amount of bringing carriers into existence becomes large and reduction and dissociation of the organic acid are promoted. According the above, it can be considered that a complex ion-forming ability is improved and an effect of removing metal impurities near to the surface of the substrate is heightened.

In the invention according to the eighth embodiment, the mixed solution of the first washing step is preferably a washing solution relating to the first embodiment. As the oxidizing solution of the second washing step, there may be mentioned a dissolved ozone aqueous solution, hydrogen peroxide solution or nitric acid. Among them, the dissolved ozone aqueous solution is preferred since it is high purity, high oxidizing power with a low concentration and easily available. An ozone concentration of the dissolved ozone aqueous solution is preferably 0.5 ppm or more. If it is less than 0.5 ppm, it is difficult to form a hydrophilic oxidized film on the surface of the substrate, and decomposition and removal effects of organic acids or organic substances adhered to the surface of the substrate are lowered. Since a dissolution limit of ozone to pure water is about 25 ppm, the ozone concentration of the dissolved ozone aqueous solution is more preferably 5 to 25 ppm.

Next, a phenomenon in which metal impurities adheres to a semiconductor substrate represented by a silicon wafer and deposited thereon when the substrate is washed with hydrofluoric acid, and a phenomenon in which metal impurities adheres to the substrate and deposited thereon when the substrate is washed with hydrofluoric acid and an organic acid are explained.

(a) A Phenomenon in which Metal Impurities Adheres to a Substrate and Deposited thereon when the Substrate is Washed with Hydrofluoric Acid When a metal ion is contained in a solution which does not etch the surface of a wafer and metal impurities in the solution adheres to the surface of a wafer, the metals adhering to the surface can be classified into two kinds one of which is an element which easily forms a silicide and the other is an element which easily forms a silicate. As the element easily forming a silicide, there may be mentioned Cu, Ni and the like which easily bind to silicon and as the element easily forming a silicate, there may be mentioned Fe, Al, Zn and the like which easily bind to a silicon oxide. For example, when a silicon wafer is washed with a high concentration hydrofluoric acid, a naturally oxidized film on the surface of the wafer is removed and about 90% of the surface of the wafer is terminated by hydrogen atom. According to the above, a surface potential of the wafer is lowered and Cu, Ni, etc. which easily form a silicide accept an electron from the surface of the wafer to adhere to the surface of the wafer. Easiness of transfer the electron to an ion species such as a Cu ion, etc. from the surface of the wafer depends on an interfacial level in the solution. In the above-mentioned state, it can be considered that the interfacial level thereof is in the state near to that of the silicon wafer and electrons transfer through an electron transitional step so that this kind of a metal ion transfers to the surface of the wafer.

To the contrary, when a silicon wafer is washed with a low concentration hydrofluoric acid, an etching ability of the naturally oxidized film is lowered and a ratio of the naturally oxidized film remained at the surface of the wafer becomes large so that Fe, Al, Zn, etc. which easily form a silicate adhere to the surface of the wafer. In this state, interfacial levels are markedly apart from each other between the metal species to be adhered and the surface of the wafer whereby no transitional step of electrons as mentioned above does occur easily. In Fe ion, etc., an energy gap to go over in case where an oxide is formed by binding with oxygen is lower than that of directly binding with silicon. Thus, it can be considered that Fe ion, etc. would belong to chemical reaction system depending on both of contact frequencies of the Fe ion and a silicon oxide compound. (b) A Phenomenon in which Metal Impurities Adheres to a Substrate and Deposited thereon when the Substrate is Washed with Hydrofluoric Acid and an Organic Acid When a mixed solution of hydrofluoric acid and an organic acid is made a washing solution, adhesion and deposition phenomenon of the metal can be considered to be a complex system of the above-mentioned (a) as a base. That is, depending on how much amounts of hydrofluoric acid and an organic acid is present in the washing solutions the above-mentioned adhesion and deposition phenomenon will change. As a factor to determine the adhesion phenomenon, there are dissociation constant or ionization constant of the acid. When the constant is large, much amounts of protons are released and ion species of the acid increase. In the mixed system of hydrofluoric acid and an organic acid, it can be considered that an acid having a larger dissociation constant will be more predominantly dissociated When the respective first Dissociation constants of hydrofluoric acid and various kinds of organic acids are arranged in order of size, the results are the following formula (1).

Oxalic acid>EDTA>tartaric acid>citric acid≈hydrofluoric acid>succinic acid>acetic acid    (1)

In the washing solution in which hydrofluoric acid and an organic acid are mixed of the present invention) whereas it has not yet been clarified sufficiently that how the adhesion and deposition phenomenon of metals changes by changing a kind of the organic acid or the concentration of hydrofluoric acid from the above-mentioned formula (1), it can be estimated as mentioned below.

(i) In Case of a Washing Solution Containing Oxalic Acid, EDTA or Tartaric Acid and Hydrofluoric Acid When a silicon wafer contaminated by metal impurities is washed with an organic acid having a larger acid dissociation constant than that of hydrofluoric acid and hydrofluoric acid, dissociation of the organic acid predominantly occur and hydrofluoric acid does not dissociate than the case where it exists alone whereby it easily remaining the washing solution as an HF molecule. Thus, silicon oxide is decomposed by a chemical reaction with the HF molecule so that the surface of the wafer is terminated by hydrogen atoms. When an amount of the HF molecules is large, in other words, when the concentration of hydrofluoric acid is high, the naturally oxidized film can be removed and a metal which easily forms a silicide such as Cu will be easily adhered and deposited. However, decrease in an adsorbed amount accompanied by increase in an amount of the organic acid is based on a coordination effect of an organic acid ion. On the other hand, a metal which easily forms a silicate such as Fe becomes difficultly adhered and deposited. The metal such as Fe becomes easily formable of a complex ion due to increase in the concentration of the organic acid and an amount of deposit is lowered.

(ii) In Case of a Washing Solution Containing Succinic Acid or Acetic Acid and Hydrofluoric Acid When a silicon wafer contaminated by metal impurities is washed with an organic acid having a smaller acid dissociation constant than that of hydrofluoric acid and hydrofluoric acid, dissociation of hydrofluoric acid is strong so that it can hardly be remained as a HF molecule and an etching ability of the naturally oxidized film is lowered. Thus, the naturally oxidized film is remained and when the concentration of hydrofluoric acid becomes high, at metal which easily forms a silicide such as Cu becomes to be difficultly adhered and deposited. On the other hand, a metal which easily forms a silicate such as Fe becomes to be easily adhered and deposited. However, a metal such as Fe easily forms a complex ion due to increase in the concentration of the organic acid so that an adhered a-mount to the surface of a wafer is lowered.

(iii) In Case of a Washing Solution Containing Citric Acid and Hydrofluoric Acid Since there is substantially no difference in dissociation ability between citric acid and hydrofluoric acid, an acid with a higher concentration among the citric acid and the hydrofluoric acid dominates the system. That is, when the concentration of hydrofluoric acid is lower than that of the citric acid, citric acid becomes dominant so that hydrofluoric acid becomes to be difficultly dissociated and easily remained as an HF molecule. Thereby the naturally oxidized film is removed and a metal which easily forms a silicide such as Cu becomes to be easily adhered and deposited. To the contrary, when the concentration of hydrofluoric acid becomes higher than that of the hydrofluoric acid, dissociation of hydrofluoric acid dominates the system. However, an amount of HF molecules which are not dissociated is also increased so that the naturally oxidized film is removed and a metal which easily forms a silicide such as Cu becomes to be easily adhered and deposited. On the other hand, a metal which easily forms a silicate such as Fe also becomes to be easily adhered and deposited. However, the metal such as Fe becomes to be easily formed due to increase in the concentration of the organic acid and an adhered amount to the surface of the wafer is lowered.

EXAMPLES

Next, the present invention is explained in detail by referring to Examples and Comparative examples which do not limit the scope of the present invention.

Examples 1 to 9

As shown in Table 1, as an organic acid, 0.0006% by weight, 0.006% by weight and 0.06% by weight of citric acids were mixed with pure water, respectively. To a citric acid aqueous solution containing 0.0006% by weight of the acid were added 0.005% by weight, 0.05% by weight and 0.25% by weight of hydrofluoric acid, respectively, to prepare washing solutions. Also, to a citric acid aqueous solution containing 0.006% by weight of the acid were added 0.005% by weight, 0.05% by weight and 0.25% by weight of hydrofluoric acid, respectively, to prepare washing solutions. Further, to a citric acid aqueous solution containing 0.06% by weight of the acid were added 0.005% by weight, 0.05% by weight and 0.25% by weight of hydrofluoric acid, respectively, to prepare washing solutions. pH of the respective washing solutions are shown in Table 4.

Examples 10 to 15

As shown in Table 1, as an organic acid, 0.00003% by weight and 0.003% by weight of succinic acids were mixed with pure water, respectively. To a succinic acid aqueous solution containing 0.00003% by weight of the acid were added 0.005% by weight, 0.05% by weight and 0.25% by weight of hydrofluoric acid, respectively, to prepare washing solutions. Also, to a succinic acid aqueous solution containing 0.003% by weight of the acid were added 0.005% by weight, 0.05% by weight and 0.25% by weight of hydrofluoric acid, respectively, to prepare washing solutions. pH of the respective washing solutions are shown in Table 4.

Examples 16 to 21

As shown in Table 2, as an organic acid, 0.00008% by weight and 0.0008% by weight of ethylenediaminetetraacetic acids (EDTA) were mixed with pure water, respectively. To an EDTA aqueous solution containing 0.00008% by weight of the acid were added 0.005% by weight, 0.05% by weight and 0.25% by weight of hydrofluoric acid, respectively, to prepare washing solutions. Also, to an EDTA aqueous solution containing 0.0008% by weight of the acid were added 0.005% by weight, 0.05% by weight and 0.25% by weight of hydrofluoric acid, respectively, to prepare washing solutions. pH of the respective washing solutions are shown in Table 4.

Examples 22 to 27

As shown in Table 2, as an organic acid,, 0.0003% by weight and 0.003% by weight of tartaric acids were mixed with pure water, respectively. To a tartaric acid aqueous solution containing 0.0003% by weight of the acid were added 0.005% by weight, 0.05% by weight and 0.25% by weight of hydrofluoric acid, respectively, to prepare washing solutions. Also, to a tartaric acid aqueous solution containing 0.003% by weight of the acid were added 0.005% by weight, 0.05% by weight and 0.25% by weight of hydrofluoric acid, respectively, to prepare washing solutions. pH of the respective washing solutions are shown in Table 4.

Examples 28 to 36

As shown in Table 3, as an organic acid., 0.00027% by weight, 0.0027% by weight and 0.027% by weight of oxalic acids were mixed with pure water, respectively. To an oxalic acid aqueous solution containing 0.00027% by weight of the acid were added 0.005% by weight, 0.05% by weight and 0.25% by weight of hydrofluoric acid, respectively, to prepare washing solutions. Also, to an oxalic acid aqueous solution containing 0.0027% by weight of the acid were added 0.005% by weight, 0.05% by weight and 0.25% by weight of hydrofluoric acid, respectively, to prepare washing solutions. Further, to an oxalic acid aqueous solution containing 0.027% by weight of the acid were added 0.005% by weight, 0.05% by weight and 0.25% by weight of hydrofluoric acid, respectively, to prepare washing solutions. pH of the respective washing solutions are shown in Table 5.

Examples 37 to 42

As shown in Table 3, as an organic acid, 0.00018% by weight and 0.018% by weight of acetic acids were mixed with pure water, respectively. To an acetic acid aqueous solution containing 0.00018% by weight of the acid were added 0.005% by weight, 0.05% by weight and 0.25% by weight of hydrofluoric acid, respectively, to prepare washing solutions. Also, to an acetic acid aqueous solution containing 0.018% by weight of the acid were added 0.005% by weight, 0.05% by weight and 0.25% by weight of hydrofluoric acid, respectively, to prepare washing solutions. pH of the respective washing solutions are shown in Table 5.

To these washing solution at room temperature were compulsory added five metal ions of Fe, Ni, Cu, Zn and Al in amounts of each 100 ppb and polystyrene latex particles with a particle size of 0.294 $\mu$m in an amount of 8000 particles/0.1 ml. The above-mentioned metal concentrations are about 1000-folds or more as compared with the metal concentrations contained in a usual solution. On the other hand, a silicon wafer cleaned with an SC1 solution (a mixed solution of $H_2O:H_2O_2(30\%):NH_4OH(29\%)=5:1:0.25$) was prepared and the silicon wafer was immersed in the above-mentioned washing solutions for 10 minutes. Subsequently, the wafer was rinsed by ultrapure water for 10 minutes and water drops on the surface of the wafer were removed by centrifugal force to dry the wafer.

According to the above procedure, peeling off of a naturally oxidized film on the surface of the wafer, complexing ions of metal impurities and control of each surface potential of the wafer, fine particles and metal impurities were carried out as mentioned above to clean the silicon wafer.

Comparative Example 1

The conventional RCA washing method is made Comparative example 1. That is, in an SC1 solution (a mixed solution of $H_2O:H_2O_2(30\%):NH_4OH(29\%)=5:1:1$) to which the same metal ions and fine particles used in Examples were added with the same amounts, a silicon wafer cleaned by another SC1 solution was immersed, heated to 75 to 80° C. and maintained at 80° C. for 10 minutes. After this silicon wafer was rinsed by ultrapure water, the wafer was immersed in a mixed solution of $H_2O:HF(49\%)=50:1$ for 15 seconds and further rinsed by ultrapure water. Subsequently, the rinsed silicon wafer was immersed in an SC2 solution (a mixed solution of $H_2O:H_2O_2(30\%):HCl(37\%)=6:1:1$), heated to 75 to 80° C. and maintained at 80° C. for 10 minutes. Thereafter, the silicon wafer was rinsed by ultrapure water in the same manner as in above-mentioned Examples and dried.

Comparative Example 2

A washing solution was prepared by adding 1% by weight of hydrofluoric acid to a solution prepared by mixing 0.005% by weight of ethylenediaminetetraacetic acid as an organic acid with pure water and pH of the solution was adjusted to 1. To the washing solution were added metal ions and fine particles which are similar to those used in Examples with the same amounts, and then a silicon wafer was immersed in the washing solution for 10 minutes. Thereafter, the silicon wafer was rinsed by ultrapure water in the same manner as in the above-mentioned Examples and dried.

Comparative Example 3

A washing solution was prepared by adding 0.05% by weight of hydrofluoric acid to pure water. To the washing solution were added metal ions and fine particles which are similar to those used in Examples with the same amounts, and then a silicon wafer was immersed in the washing solution for 10 minutes Thereafter, the silicon wafer was rinsed by ultrapure water in the same manner as in the above-mentioned Examples and dried.

Comparative Example 4

A washing solution was prepared by adding 0.25% by weight of hydrofluoric acid to pure water. To the washing solution were added metal ions and fine particles which are similar to those used in Examples with the same amounts, and then a silicon wafer was immersed in the washing solution for 10 minutes. Thereafter, the silicon wafer was rinsed by ultrapure water in the same manner as in the above-mentioned Examples and dried Comparative Test and Evaluation (a) Metal Impurities Concentrations Metal impurities concentrations were measured on the surface of the silicon wafers after washing them with washing solutions prepared in Examples 1 to 4, 7 to 11, 14, 15, 17, 18, 21 to 23, 26 to 29, 31, 34, 35, 37 to 42 and Comparative example 1 These metal impurities concentrations were measured by dropping a mixed acid of hydrofluoric acid and nitric acid to the center portion of the silicon wafer after washing, and after developing liquid drops to cover the whole surface of the silicon wafer, and recovering the liquid drops to analyze them by atomic-absorption spectroscopy. The results are shown in Table 1 to Table 3.

From Table 1 to Table 3, adhesion and deposition phenomenon of metals of the above-mentioned (i) to (iii) were confirmed.

(b) Relatively Increased Amount of Particles

The number of remained particles on the surface of the respective wafers after washing them with each of washing solutions prepared in Examples 1, 4, 7, 12, 15, 18, 20, 22, 24, 26, 31 and Comparative examples 1 to 4 was measured. The number of remained particles was measured by counting particles with a particle size of 0.2 $\mu$m or more remained on the surface of the silicon wafer after washing with a particle counter. The results are shown in Table 4 and Table 5.

As clearly seen from Table 4 and Table 5, in each washing solution of the above-mentioned Examples and Comparative example 1, 8 to 78 particles are remained. To the contrary, in washing solutions of Comparative examples 2 to 4, 218 to particles are remained. From the above results, it can be understood that the washing solutions of Examples well out the particles as compared with those of Comparative examples 2 to 4.

TABLE 1

| | | Hydrofluoric acid concentration (wt %) | Name of Organic acid | Organic acid concentration (wt %) | Metal impurity concentration | | | | |
|---|---|---|---|---|---|---|---|---|---|
| | | | | | Fe | Ni | Zn | Cu | Al |
| Example | 1 | 0.005 | Citric acid | 0.0006 | $4.5 \times 10^{11}$ | $<1 \times 10^{10}$ | $<1 \times 10^{10}$ | $4.3 \times 10^{14}$ | $<1 \times 10^{10}$ |
| | 2 | | | 0.006 | $2.6 \times 10^{11}$ | $<1 \times 10^{10}$ | $<1 \times 10^{10}$ | $2.6 \times 10^{14}$ | $<1 \times 10^{10}$ |
| | 3 | | | 0.06 | $<1 \times 10^{10}$ | $<1 \times 10^{10}$ | $<1 \times 10^{10}$ | $6.2 \times 10^{12}$ | $<1 \times 10^{10}$ |
| | 4 | 0.05 | | 0.0006 | $<1 \times 10^{10}$ | $<1 \times 10^{10}$ | $<1 \times 10^{10}$ | $<1 \times 10^{10}$ | $<1 \times 10^{10}$ |
| | 5 | | | 0.006 | — | — | — | — | — |
| | 6 | | | 0.06 | — | — | — | — | — |
| | 7 | 0.25 | | 0.0006 | $<1 \times 10^{10}$ | $<1 \times 10^{10}$ | $<1 \times 10^{10}$ | $2.7 \times 10^{12}$ | $<1 \times 10^{10}$ |
| | 8 | | | 0.006 | $<1 \times 10^{10}$ | $<1 \times 10^{10}$ | $<1 \times 10^{10}$ | $3.0 \times 10^{12}$ | $<1 \times 10^{10}$ |

TABLE 1-continued

| | | Hydrofluoric acid concentration (wt %) | Name of Organic acid | Organic acid concentration (wt %) | Metal impurity concentration | | | | |
|---|---|---|---|---|---|---|---|---|---|
| | | | | | Fe | Ni | Zn | Cu | Al |
| | 9 | | | 0.06 | <1 × $10^{10}$ | <1 × $10^{10}$ | <1 × $10^{10}$ | 2.9 × $10^{12}$ | <1 × $10^{10}$ |
| | 10 | 0.005 | Succinic acid | 0.00003 | <1 × $10^{10}$ | <1 × $10^{10}$ | <1 × $10^{10}$ | 7.3 × $10^{11}$ | <1 × $10^{10}$ |
| | 11 | | | 0.003 | <1 × $10^{10}$ | <1 × $10^{10}$ | <1 × $10^{10}$ | 1 × $10^{12}$ | <1 × $10^{10}$ |
| | 12 | 0.05 | | 0.00003 | — | — | — | — | — |
| | 13 | | | 0.003 | — | — | — | — | — |
| | 14 | 0.25 | | 0.00003 | <1 × $10^{10}$ | <1 × $10^{10}$ | <1 × $10^{10}$ | 1.5 × $10^{11}$ | — |
| | 15 | | | 0.003 | <1 × $10^{10}$ | <1 × $10^{10}$ | <1 × $10^{10}$ | 1 × $10^{11}$ | — |

TABLE 2

| | | Hydrofluoric acid concentration (wt %) | Name of Organic acid | Organic acid concentration (wt %) | Metal impurity concentration | | | | |
|---|---|---|---|---|---|---|---|---|---|
| | | | | | Fe | Ni | Zn | Cu | Al |
| Example | 16 | 0.005 | EDTA | 0.00008 | — | — | — | — | — |
| | 17 | | | 0.0008 | <1 × $10^{10}$ | <1 × $10^{10}$ | <1 × $10^{10}$ | <1 × $10^{10}$ | <1 × $10^{10}$ |
| | 18 | 0.05 | | 0.00008 | — | — | — | — | — |
| | 19 | | | 0.0008 | 2 × $10^{10}$ | <1 × $10^{10}$ | <1 × $10^{10}$ | 2 × $10^{10}$ | <1 × 10 |
| | 20 | 0.25 | | 0.00008 | — | — | — | — | — |
| | 21 | | | 0.0008 | <1 × $10^{10}$ | <1 × $10^{10}$ | <1 × $10^{10}$ | 4 × $10^{11}$ | <1 × $10^{10}$ |
| | 22 | 0.005 | Tartaric acid | 0.0003 | <1 × $10^{10}$ | <1 × $10^{10}$ | <1 × $10^{10}$ | 1.1 × $10^{13}$ | <1 × $10^{10}$ |
| | 23 | | | 0.003 | <1 × $10^{10}$ | <1 × $10^{10}$ | <1 × $10^{10}$ | 7.7 × $10^{12}$ | <1 × $10^{10}$ |
| | 24 | 0.05 | | 0.0003 | — | — | — | — | — |
| | 25 | | | 0.003 | — | — | — | — | — |
| | 26 | 0.25 | | 0.0003 | <1 × $10^{10}$ | <1 × $10^{10}$ | <1 × $10^{10}$ | 1.8 × $10^{12}$ | <1 × $10^{10}$ |
| | 27 | | | 0.003 | <1 × $10^{10}$ | <1 × $10^{10}$ | <1 × $10^{10}$ | 4.3 × $10^{11}$ | <1 × $10^{10}$ |

TABLE 3

| | | Hydrofluoric acid concentration (wt %) | Name of Organic acid | Organic acid concentration (wt %) | Metal impurity concentration | | | | |
|---|---|---|---|---|---|---|---|---|---|
| | | | | | Fe | Ni | Zn | Cu | Al |
| Example | 28 | 0.005 | Oxalic acid | 0.00027 | — | — | — | 4.5 × $10^{11}$ | <1 × $10^{10}$ |
| | 29 | | | 0.0027 | <1 × $10^{10}$ | <1 × $10^{10}$ | <1 × $10^{10}$ | <1 × $10^{10}$ | <1 × $10^{10}$ |
| | 30 | | | 0.027 | — | — | — | — | — |
| | 31 | 0.05 | | 0.00027 | — | — | — | 1.6 × $10^{13}$ | 1.2 × $10^{10}$ |
| | 32 | | | 0.0027 | — | — | — | — | — |
| | 33 | | | 0.027 | — | — | — | — | — |
| | 34 | 0.25 | | 0.00027 | 2.8 × $10^{10}$ | <1 × $10^{10}$ | <1 × $10^{10}$ | 4.8 × $10^{13}$ | <1 × $10^{10}$ |
| | 35 | | | 0.0027 | — | <1 × $10^{10}$ | <1 × $10^{10}$ | 4.3 × $10^{12}$ | <1 × $10^{10}$ |

TABLE 3-continued

|  | | Hydrofluoric acid concentration (wt %) | Name of Organic acid | Organic acid concentration (wt %) | Metal impurity concentration | | | | |
|---|---|---|---|---|---|---|---|---|---|
|  | | | | | Fe | Ni | Zn | Cu | Al |
|  | 36 | | | 0.027 | — | — | — | — | — |
|  | 37 | 0.005 | Acetic acid | 0.00018 | <1 × $10^{10}$ | <1 × $10^{10}$ | <1 × $10^{10}$ | 9 × $10^{12}$ | 4.9 × $10^{10}$ |
|  | 38 | | | 0.018 | <1 × $10^{10}$ | <1 × $10^{10}$ | <1 × $10^{10}$ | 1.5 × $10^{12}$ | <1 × $10^{10}$ |
|  | 39 | 0.05 | | 0.00018 | <1 × $10^{10}$ | <1 × $10^{10}$ | <1 × $10^{10}$ | 5.2 × $10^{11}$ | 1.3 × $10^{10}$ |
|  | 40 | | | 0.018 | <1 × $10^{10}$ | <1 × $10^{10}$ | <1 × $10^{10}$ | 4.7 × $10^{11}$ | 1 × $10^{10}$ |
|  | 41 | 0.25 | | 0.00018 | <1 × $10^{10}$ | <1 × $10^{10}$ | <1 × $10^{10}$ | 1.1 × $10^{12}$ | <1 × $10^{10}$ |
|  | 42 | | | 0.018 | <1 × $10^{10}$ | <1 × $10^{10}$ | <1 × $10^{10}$ | 5.4 × $10^{11}$ | <1 × $10^{10}$ |
| Comparative example | 1 | | (RCR Washing) | | <1 × $10^{10}$ | <1 × $10^{10}$ | <1 × $10^{10}$ | 1.5 × $10^{11}$ | 4.0 × $10^{10}$ |

TABLE 4

|  |  | Hydrofluoric acid concentration (wt %) | Name of organic acid | Organic acid concentration (wt %) | pH | Adhered number of particles having 0.2 μm or more |
|---|---|---|---|---|---|---|
| Example | 1 | 0.005 | Citric acid | 0.0006 | 3.0 | 12 |
|  | 2 | | | 0.006 | 2.9 | — |
|  | 3 | | | 0.06 | 2.3 | — |
|  | 4 | 0.05 | | 0.0006 | 2.8 | 15 |
|  | 5 | | | 0.006 | 2.4 | — |
|  | 6 | | | 0.06 | 2.2 | — |
|  | 7 | 0.25 | | 0.0006 | 2.0 | 64 |
|  | 8 | | | 0.006 | 2.0 | — |
|  | 9 | | | 0.06 | 2.0 | — |
|  | 10 | 0.005 | Succinic acid | 0.00003 | 3.2 | — |
|  | 11 | | | 0.003 | 3.2 | — |
|  | 12 | 0.05 | | 0.00003 | 2.7 | 51 |
|  | 13 | | | 0.003 | 3.4 | — |
|  | 14 | 0.25 | | 0.00003 | 2.0 | — |
|  | 15 | | | 0.003 | 2.0 | 72 |
|  | 16 | 0.005 | EDTA | 0.00008 | 3.1 | — |
|  | 17 | | | 0.0008 | 3.0 | — |
|  | 18 | 0.05 | | 0.00008 | 2.4 | 8 |
|  | 19 | | | 0.0008 | 2.3 | — |
|  | 20 | 0.25 | | 0.00008 | 2.0 | 16 |
|  | 21 | | | 0.0008 | 2.0 | — |
|  | 22 | 0.005 | Tartaric acid | 0.0003 | 3.1 | 49 |
|  | 23 | | | 0.003 | 2.4 | — |
|  | 24 | 0.05 | | 0.0003 | 2.8 | 41 |
|  | 25 | | | 0.003 | 2.1 | — |
|  | 26 | 0.25 | | 0.0003 | 2.0 | 78 |
|  | 27 | | | 0.003 | 2.0 | — |

TABLE 5

|  |  | Hydrofluoric acid concentration (wt %) | Name of organic acid | Organic acid concentration (wt %) | pH | Adhered number of particles having 0.2 μm or more |
|---|---|---|---|---|---|---|
| Example | 28 | 0.005 | Oxalic acid | 0.00027 | 3.0 | — |
|  | 29 | | | 0.0027 | 2.6 | — |
|  | 30 | | | 0.027 | 2.0 | — |

TABLE 5-continued

|  | | Hydrofluoric acid concentration (wt %) | Name of organic acid | Organic acid concentration (wt %) | pH | Adhered number of particles having 0.2 µm or more |
|---|---|---|---|---|---|---|
|  | 31 | 0.05 | | 0.00027 | 2.9 | 43 |
|  | 32 | | | 0.0027 | 2.7 | — |
|  | 33 | | | 0.027 | 2.4 | — |
|  | 34 | 0.25 | | 0.00027 | 2.0 | — |
|  | 35 | | | 0.0027 | 2.0 | — |
|  | 36 | | | 0.027 | 2.0 | — |
|  | 37 | 0.005 | Succinic | 0.00018 | 3.1 | — |
|  | 38 | | acid | 0.0018 | 2.9 | — |
|  | 39 | 0.05 | | 0.00018 | 2.9 | — |
|  | 40 | | | 0.0018 | 2.8 | — |
|  | 41 | 0.25 | | 0.00018 | 2.0 | — |
|  | 42 | | | 0.0018 | 2.0 | — |
| Compara- | 1 | | (RCA washing) | — | | 10 |
| tive | 2 | 1.00 | EDTA | 0.005 | 1.0 | 2123 |
| example | 3 | 0.05 | None | — | — | 218 |
|  | 4 | 0.25 | | — | — | 1542 |

Example 43

First, Fe ion is added to an SC1 solution (a mixed solution of $H_2O:H_2O_2(30\%):NH_4OH(29\%)=5:1:0.25$) in an amount of 100 ppb, and the mixture was raised to 80° C. Then, a silicon wafer was immersed in the solution of 80° C. for 10 minutes, rinsed for 10 minutes and water drops on the surface of the wafer were removed and dried On the other hand, a washing solution in which 0.006% by weight of citric acid was added to pure water as an organic acid, having pH of 4.0 was prepared. The above-mentioned metal-contaminated silicon wafer was immersed in the washing solution at room temperature for 10 minutes, and irradiated light having an intensity of illumination of 100,000 lux and a wavelength of 500 nm to the surface of the silicon wafer. Thereafter, this silicon wafer was rinsed with ultrapure water for 10 minutes. According to the above procedure, peeling off of a naturally oxidized film on the surface of the wafer, complexing ions of metal impurities and control of each surface potential of the wafer, fine particles and metal impurities were carried out as mentioned above to clean the silicon wafer.

Example 44

In the same manner as in Example 43 except for changing the wavelength of the light to be irradiated to 550 nm, a silicon wafer was washed.

Example 45

In the same manner as in Example 43 except for changing the wavelength of the light to be irradiated to 600 nm, a silicon wafer was washed.

Example 46

In the same manner as in Example 43 except for changing the wavelength of the light to be irradiated to 650 nm, a silicon wafer was washed.

Comparative Example 5

In the same manner as in Example 43 except for no light is irradiated, a silicon wafer was washed.

Comparative Example 6

In the same manner as in Example 43 except for changing the wavelength of the light to be irradiated to 450 nm, a silicon wafer was washed.

Fe concentrations on the surfaces of the silicon wafers of Examples 43 to 46 and Comparative examples 5 and 6 after washing were examined. These metal impurities concentrations were measured by dropping a mixed acid of hydrofluoric acid and nitric acid to the center portion of the silicon wafer after washing, and after developing liquid drops to cover the whole surface of the silicon wafer, and recovering the liquid drops to analyze them by atomic-absorption spectroscopy. The results are shown in FIG. 4.

Figure 4:
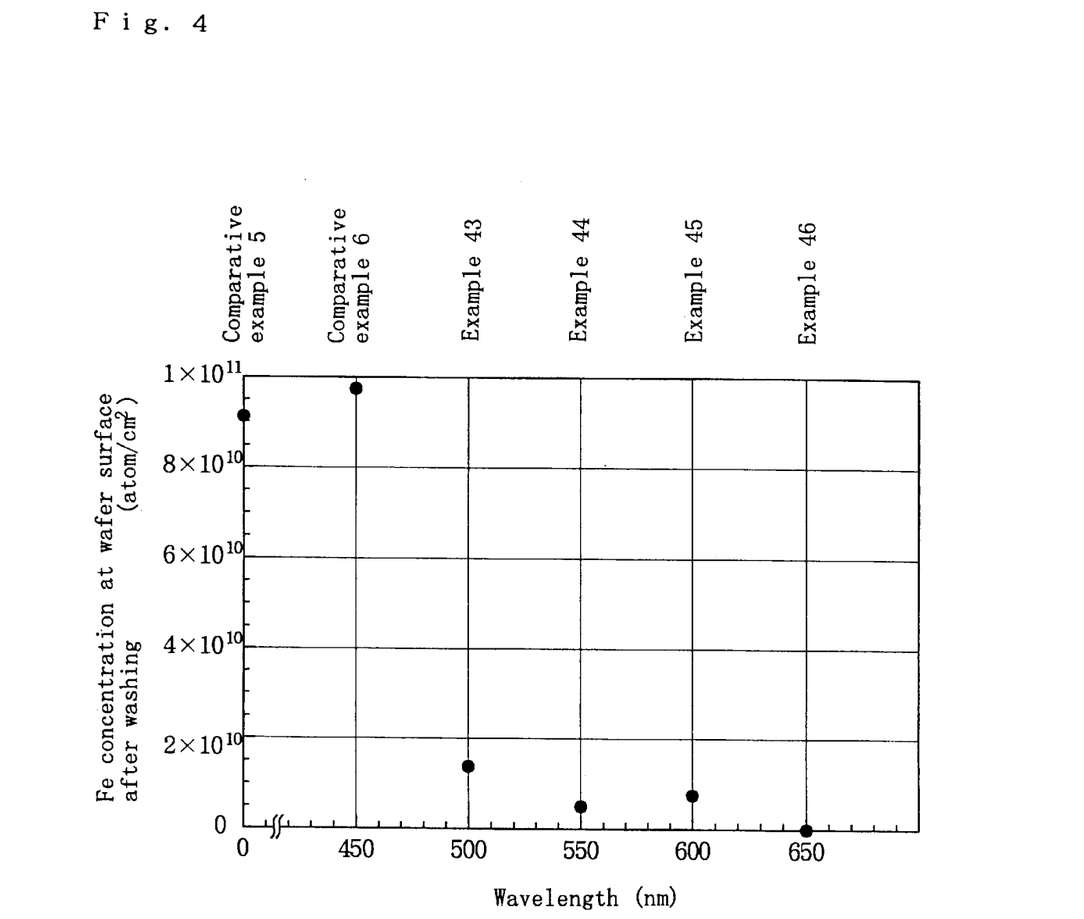
FIG. 4 is a drawing showing a removing effect of Fe in Example and Comparative example when wavelength of an irradiated light is changed.

As can be clearly seen from FIG. 4, when a wavelength of irradiated light is made 500 nm or more as in Examples 43 to 46, it can be understood that Fe concentrations became about one order smaller than those of Comparative examples 5 and 6.

EXAMPLE 47

A silicon wafer to the surface of which is adhered five metal of Al, Fe, Cu, Ni and Zn previously was prepared by the following method. First, to a SC1 solution (a mixed solution of $H_2O:H_2O_2(30\%):NH_4OH(29\%)=5:1:0.25$) was compulsorily added five metal ions of Al, Fe, Cu, Ni and Zn in amounts of each 100 ppb. This solution was raised to 80° C., and after immersing the silicon wafer in the solution at 80° C. for 10 minutes, the wafer was rinsed for 10 minutes, then it was rinsed and water drops on the surface of the wafer were removed by centrifugal force and dried.

As the first washing step, a mixed solution was prepared by adding 0.05% by weight of hydrofluoric acid to a solution in which 0.006% by weight of citric acid was added to pure water as an organic acid, and adjusted to pH 3.0 was prepared. In the mixed solution at room temperature was immersed the silicon wafer contaminated by the above-mentioned metal impurities and then washed under ultrasonic wave for 10 minutes. Thereafter, this silicon wafer was rinsed with ultrapure water for 10 minutes.

Next, as the second washing step, this washed silicon wafer was immersed in a dissolved ozone aqueous solution with an ozone concentration of 8 ppm for 10 minutes. Thereafter, this silicon wafer was rinsed with ultrapure water for 10 minutes.

Subsequently, after the silicon wafer was washed again with the above-mentioned first washing step, and then washed again with the above-mentioned second washing step. That is, the first washing step and the second washing step were each carried out twice, respectively.

Comparative Example 7

The conventional RCA washing method is made Comparative example 7. That is, in the same manner as in Example 47, a silicon wafer contaminated with metal impurities was immersed in an SC1 solution (a mixed solution of $H_2O:H_2O_2(30\%):NH_4OH(29\%)=5:1:1$), heated to 75 to 80° C. and maintained at 80° C. for 10 minutes. After the silicon wafer was rinsed by ultrapure water, it was immersed in a mixed solution of $H_2O:HF(49\%)=50:1$ for 15 seconds, and further rinsed by ultrapure water. Subsequently, the silicon wafer rinsed was immersed in an SC2 solution (a mixed solution of $H_2O:H_2O_2(30\%):HCl(37\%)=6:1:1$), heated to 75 to 80° C. and maintained at 80° C. for 10 minutes. Thereafter, the silicon wafer was rinsed by ultrapure water in the same manner as in Example 47.

After this silicon wafer was washed again with the SC1 solution as mentioned above, it was further washed again with the SC2 solution as mentioned above. That is, washing with the SC1 solution and washing with the SC2 solution were carried out each twice.

Comparative Test and Evaluation

Metal impurities concentrations on each surface of the respective silicon wafers after washing of example 47 and Comparative example 7 were measured. This metal impurities concentrations were measured by dropping a mixed acid of hydrofluoric acid and nitric acid to the center portion of the silicon wafer after washing, and after developing liquid drops to cover the whole surface of the silicon wafer, and recovering the liquid drops to analyze them by atomic-absorption spectroscopy. The results are shown in FIG. 5.

Figure 5:
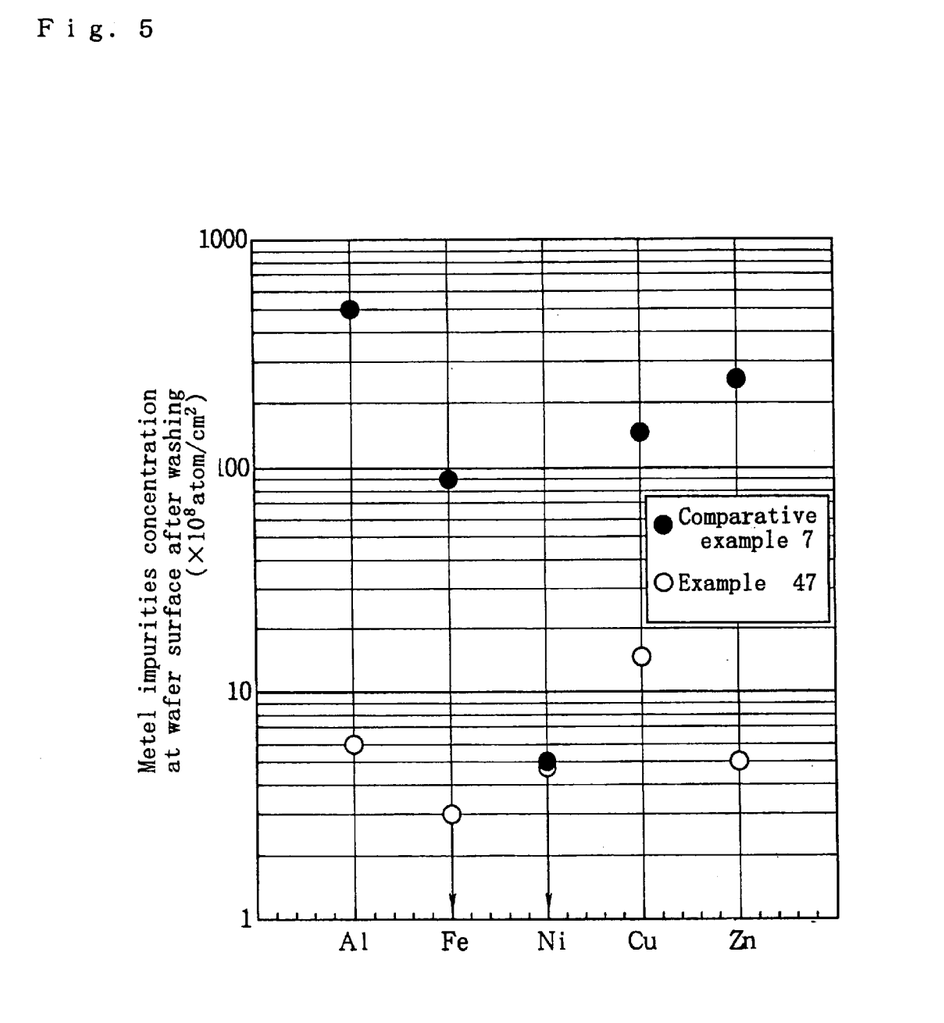
FIG. 5 is a drawing showing a metal impurity concentration at a wafer surface after washing in Example 47 and Comparative example 7.

As clearly seen from FIG. 5, it can be found that, in the wafer of Example 47, except for Ni concentration which was the same level, there are good washing effects with regard to the other five kinds of metals with the order of one digit as compared with the wafer of Comparative example 7 according to the conventional RCA washing method. Particularly, four kinds of metals of Al, Fe, Ni and Zn were each $10 \times 10^8$ atoms/cm$^2$ or less. Incidentally, an arrow to downward of Fe and Ni means lower than detection limit.

As described above, according to the washing method of the third embodiment, three actions of peeling a naturally oxidized film on the surface of the substrate, complex ionization of metal impurities, and control of each surface potential of the substrate, fine particles and metal impurities can be carried out with a single bath, and both of metal impurities and fine particles can be well removed from the semiconductor substrate. As the results, as compared with the conventional RCA washing method, washing steps can be simplified, chemical solutions for washing are only two kinds of hydrofluoric acid and an organic acid, washing can be carried out within a short period of time with a small-sized apparatus and a washing cost can be reduced.

Also, according to the washing method of the invention relating to the fifth or sixth embodiments, the photoirradiation brings minority carrier into existence near to the substrate surface, which reduces and dissociates an organic acid in the washing solution to make metal impurities into metal complex salts whereby an effect of removing metal impurities near to the surface of the substrate can be heightened. Chemical solution for washing is only one kind of an organic acid alone, or two kinds of hydrofluoric acid and an organic acid.

Further, according to the washing method of the invention relating to the eighth embodiment, three actions of peeling a naturally oxidized film on the surface of the substrate, complex ionization of metal impurities, and control of each surface potential of the substrate, fine particles and metal impurities can be carried out in the first washing step to remove both of metal impurities and fine particles well from the semiconductor substrate, and then, in the second step, an oxidized film is formed on the surface of the substrate and simultaneously an organic acid or an organic material adhered to the surface of the substrate is decomposed and removed. Thus, as compared with the conventional RCA washing method, both of metal impurities and fine particles can be well removed, and chemical solutions for washing may be only three kinds of hydrofluoric acid solution and an oxidizing solution.

What is claimed is:

1. A method of washing a semiconductor substrate which comprises steps of
   immersing a semiconductor substrate on the surface of which a naturally oxidized film is formed, fine particles and metal impurities being on the naturally oxidized film, and metal impurities contained in the naturally oxidized film, in a mixed solution bath, the mixed solution containing 0.0001 to 0.1% by weight of an organic acid and 0.005 to 0.25% by weight of hydrofluoric acid and having a pH of 2 to 4, whereby the hydrofluoric acid removes the naturally oxidized film from the substrate and the mixed solution negatively charges fine particles liberated into the mixed solution as well as the surface of the substrate, and the organic acid forms complex salts with the negatively charged fine particles in the mixed solution, and
   irradiating the surface of the semiconductor substrate in the bath with a light consisting essentially of wavelengths of in the range of 500–900 nm to reduce and dissociate the organic acid in the mixed solution to enhance effect of removing metal impurities near to the surface of the substrate.

2. The method of washing a semiconductor substrate according to claim 1, wherein the organic acid is one or more organic acid selected from the group consisting of citric acid, succinic acid, EDTA, tartaric acid, salicylic acid, oxalic acid, acetic acid and formic acid.

3. A method of washing a semiconductor substrate which comprises
   a first washing step of immersing a semiconductor substrate on the surface of which a naturally oxidized film is formed, fine particles and metal impurities being on the naturally oxidized film, and metal impurities contained in the naturally oxidized film, in a mixed solution bath, the mixed solution containing an organic acid and hydrofluoric acid with a pH of 2 to 4, whereby the hydrofluoric acid removes the naturally oxidized film from the substrate and negatively charges fine particles liberated into the mixed solution as well as the surface of the substrate to minus, respectively, and the organic forms complex salts with the negatively charged fine particles in the mixed solution, and
   a second washing step of immersing said semiconductor substrate in an oxidizing solution bath, whereby the oxidizing solution forms a hydrophilic oxidized film on the surface of the substrate and decomposes and removes the organic acids remaining on the surface of the substrate or organic substances adhered to the surface of the substrate.

4. The method of washing a semiconductor substrate according to claim 3, wherein the first washing step and the second washing step are each carried out at least twice.

5. A method of washing a semiconductor substrate according to claim 3, wherein the mixed solution of the first washing step contains 0.0001 to 0.1% by weight of an organic acid and 0.005 to 0.25% by weight of hydrofluoric acid.

6. The method of washing a semiconductor substrate according to claim 3, wherein the organic acid is one or more organic acid selected from the group consisting of citric acid, succinic acid, EDTA, tartaric acid, salicylic acid, oxalcid, acetic acid and formic acid.

7. The method of washing a semiconductor substrate according to claim 3, wherein the semiconductor substrate is subjected to ultrasonic washing with the mixed solution of the first washing step.

8. The method of washing a semiconductor substrate according to claim 3, wherein the oxidizing solution of the second washing step is a dissolved ozone aqueous solution, hydrogen peroxide solution or nitric acid.

9. The method of washing a semiconductor substrate according to claim 4, wherein the mixed solution of the first washing step contains 0.0001 to 0.1% by weight of an organic acid and 0.005 to 0.25% by weight of hydrofluoric acid.

10. The method of washing a semiconductor substrate according to claim 5, wherein the organic acid is one or more organic acid selected from a group consisting of citric acid, succinic acid, EDTA, tartaric acid, salicylic acid, oxalic acid, acetic acid and formic acid.

11. The method of washing a semiconductor substrate according to claim 4, wherein the semiconductor substrate is subjected to ultrasonic washing with the mixed solution of the first washing step.

12. The method of washing a semiconductor substrate according to claim 6, wherein the oxidizing solution of the second washing step is a dissolved ozone aqueous solution, hydrogen peroxide solution or nitric acid.

13. The method of washing a semiconductor substrate according to claim 9, wherein the organic acid is one or more organic acid selected from a group consisting of citric acid, succinic acid, EDTA, tartaric acid, salicylic acid, oxalic acid, acetic acid and formic acid.

* * * * *